United States Patent
Lee et al.

(10) Patent No.: US 12,094,761 B2
(45) Date of Patent: *Sep. 17, 2024

(54) FETs AND METHODS OF FORMING FETs

(71) Applicant: Taiwan Semiconductor Manufacturing Co., Ltd., Hsinchu (TW)

(72) Inventors: Yen-Ru Lee, Hsinchu (TW); Chii-Horng Li, Zhubei (TW); Chien-I Kuo, Hsinchu (TW); Li-Li Su, ChuBei (TW); Chien-Chang Su, Kaohsiung (TW); Heng-Wen Ting, Hsinchu (TW); Jung-Chi Tai, Tainan (TW); Che-Hui Lee, Taipei (TW); Ying-Wei Li, Taichung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,855

(22) Filed: Jun. 28, 2023

(65) Prior Publication Data
US 2023/0343635 A1    Oct. 26, 2023

Related U.S. Application Data

(60) Continuation of application No. 17/315,842, filed on May 10, 2021, now Pat. No. 11,728,208, which is a (Continued)

(51) Int. Cl.
*H01L 21/82* (2006.01)
*H01L 21/764* (2006.01)
(Continued)

(52) U.S. Cl.
CPC ........ *H01L 21/764* (2013.01); *H01L 29/0653* (2013.01); *H01L 29/0847* (2013.01);
(Continued)

(58) Field of Classification Search
None
See application file for complete search history.

(56) References Cited

U.S. PATENT DOCUMENTS

| 9,312,274 B1 | 4/2016 | Bryant et al. |
| 9,324,713 B1 | 4/2016 | Yu et al. |

(Continued)

FOREIGN PATENT DOCUMENTS

| CN | 102169853 A | 8/2011 |
| CN | 102386230 A | 3/2012 |

(Continued)

*Primary Examiner* — Benjamin P Sandvik
(74) *Attorney, Agent, or Firm* — Slater Matsil, LLP

(57) ABSTRACT

An embodiment is a structure including a first fin over a substrate, a second fin over the substrate, the second fin being adjacent the first fin, an isolation region surrounding the first fin and the second fin, a gate structure along sidewalls and over upper surfaces of the first fin and the second fin, the gate structure defining channel regions in the first fin and the second fin, a source/drain region on the first fin and the second fin adjacent the gate structure, and an air gap separating the source/drain region from a top surface of the substrate.

20 Claims, 19 Drawing Sheets

Related U.S. Application Data continuation of application No. 16/390,413, filed on Apr. 22, 2019, now Pat. No. 11,004,724, which is a continuation of application No. 15/823,157, filed on Nov. 27, 2017, now Pat. No. 10,269,618, which is a division of application No. 15/002,077, filed on Jan. 20, 2016, now Pat. No. 9,831,116.

(60) Provisional application No. 62/218,894, filed on Sep. 15, 2015.

(51) Int. Cl.
　　*H01L 29/06* (2006.01)
　　*H01L 29/08* (2006.01)
　　*H01L 29/16* (2006.01)
　　*H01L 29/161* (2006.01)
　　*H01L 29/165* (2006.01)
　　*H01L 29/24* (2006.01)
　　*H01L 29/66* (2006.01)
　　*H01L 29/78* (2006.01)

(52) U.S. Cl.
　　CPC ........ *H01L 29/1608* (2013.01); *H01L 29/161* (2013.01); *H01L 29/165* (2013.01); *H01L 29/24* (2013.01); *H01L 29/66795* (2013.01); *H01L 29/7848* (2013.01); *H01L 29/7851* (2013.01); *H01L 29/7853* (2013.01)

(56) References Cited

U.S. PATENT DOCUMENTS

| | | | |
|---|---|---|---|
| 11,004,724 | B2 | 5/2021 | Lee et al. |
| 11,728,208 | B2 * | 8/2023 | Lee .................... H01L 29/7853 |
| | | | 438/283 |
| 2011/0210404 | A1 | 9/2011 | Su et al. |
| 2012/0049294 | A1 | 3/2012 | Chen et al. |
| 2013/0171790 | A1 | 7/2013 | Wang |
| 2013/0187206 | A1 | 7/2013 | Mor et al. |
| 2014/0203370 | A1 | 7/2014 | Maeda et al. |
| 2014/0217517 | A1 | 8/2014 | Cai et al. |
| 2014/0299934 | A1 | 10/2014 | Kim et al. |
| 2014/0312398 | A1 | 10/2014 | Ching et al. |
| 2015/0041855 | A1 | 2/2015 | Liao et al. |
| 2015/0108544 | A1 | 4/2015 | Ching et al. |
| 2015/0318399 | A1 | 11/2015 | Jeong et al. |
| 2016/0315081 | A1 | 10/2016 | Park et al. |
| 2016/0372580 | A1 | 12/2016 | Ching et al. |

FOREIGN PATENT DOCUMENTS

| | | |
|---|---|---|
| CN | 103996711 A | 8/2014 |
| CN | 104103687 A | 10/2014 |
| KR | 20110098594 A | 9/2011 |
| KR | 20140122096 A | 10/2014 |
| KR | 20150125333 A | 11/2015 |
| TW | 201431092 A | 8/2014 |

\* cited by examiner

FETs AND METHODS OF FORMING FETs

CROSS-REFERENCE TO RELATED APPLICATIONS

This application is a continuation of U.S. patent application Ser. No. 17/315,842, filed May 10, 2021, now U.S. Pat. No. 11,728,208, issued Aug. 15, 2023, entitled "FETS and Methods of Forming FETS," which is a continuation of U.S. patent application Ser. No. 16/390,413, filed Apr. 22, 2019, now U.S. Pat. No. 11,004,724, issued May 11, 2021, entitled "FETS and Methods of Forming FETS," which is a continuation of U.S. patent application Ser. No. 15/823,157, filed Nov. 27, 2017, now U.S. Pat. No. 10,269,618, issued Apr. 23, 2019, entitled "FETS and Methods of Forming FETS," which is a divisional of U.S. patent application Ser. No. 15/002,077, filed Jan. 20, 2016, now U.S. Pat. No. 9,831,116, issued Nov. 28, 2017 entitled "FETs and Methods of Forming FETs," which claims the benefit of U.S. Provisional Application No. 62/218,894, filed on Sep. 15, 2015, entitled "FETS and Methods of Forming FETs," which patent applications are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. However, there are challenges to implementation of such features and processes in semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
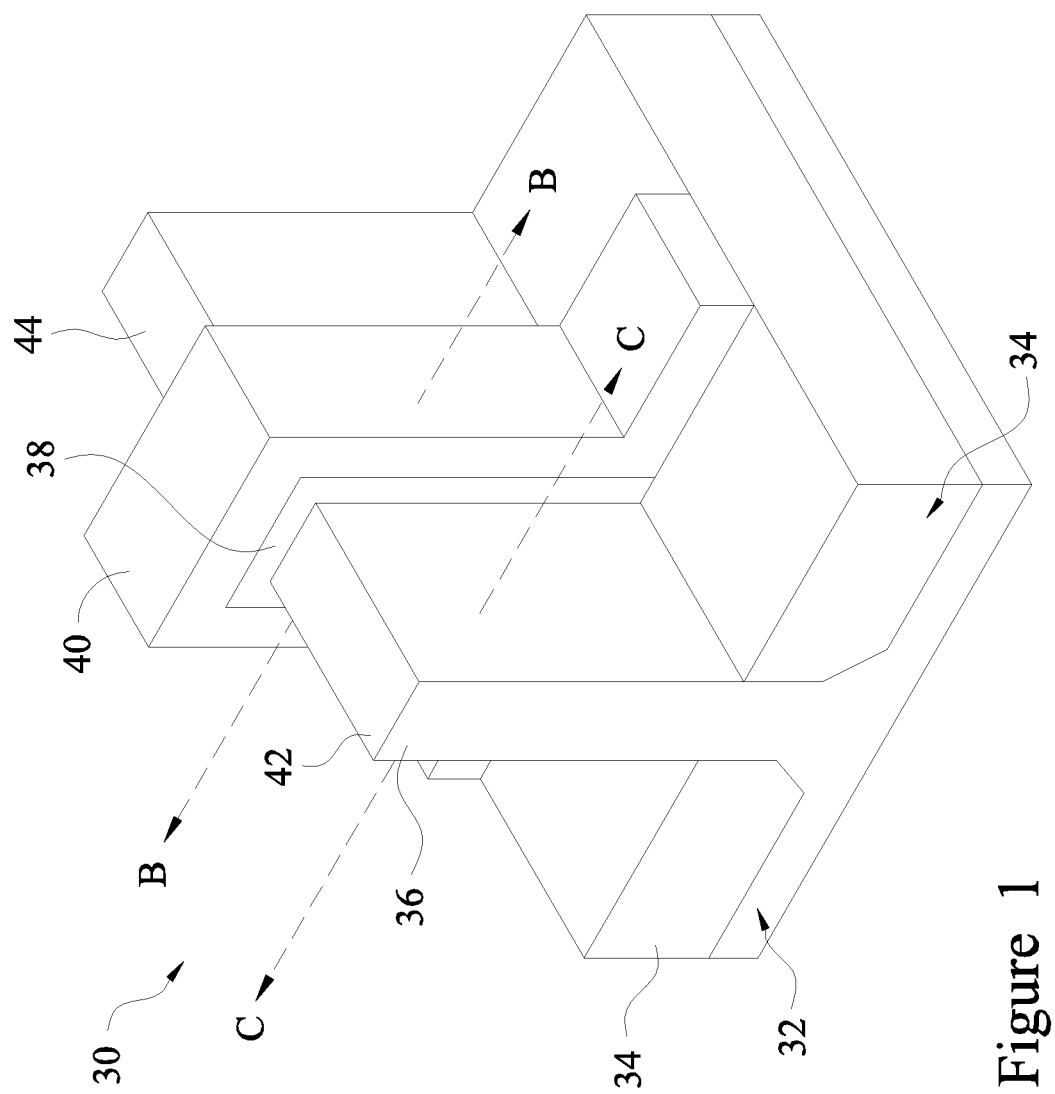
FIG. 1 is an example of a Fin Field-Effect Transistor (FinFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-first process. In other embodiments, a gate-last process (sometimes referred to as replacement gate process) may be used. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a simple and cost-effective process flow to achieve a epitaxial source/drain in a FinFET with less defects (such as dislocations), at least near a channel region of the FinFET, for device enhancement. In addition, this simple and cost-effective process flow may achieve better isolation between adjacent fins by reducing the leakage between adjacent fins and may also reduce the contact resistance to the source/drain region. In particular, embodiments such as those disclosed below include a process flow that utilizes a FinFET crown structure with some of the isolation material of the isolation region (e.g. shallow trench isolation (STI) region) remaining on a top surface of the crown between adjacent fins. This remaining isolation material suppresses the generation of dislocations because it reduces the amount of epitaxial volume between adjacent fins. Further, the isolation region causes an air gap to be formed between the top surface of the crown structure and the epitaxial source/drain region, which will reduce the dielectric constant (k value), which can reduce the parasitic capacitance between the adjacent fins. This reduced parasitic capacitance can allow for better alternating current (AC) performance for the device. Further, an upper surface of the epitaxial source/drain structure may have a non-planar (e.g. undulating and/or wavy) top surface, which can increase the contact surface area for the overlying contact. This increased contact surface area can reduce the contact resistance to the source/drain region.

In some embodiments, the disclosed process flow can be used in the formation of static random access memory (SRAM) devices. In these embodiments, the remaining isolation material between adjacent fins can help to constrain the epitaxial volume of the source/drain region which reduces the likelihood that the source/drains of adjacent SRAM transistors will merge together. This reduced likelihood of merging increases the yield of the device while still allowing for the desired reduced spacing between adjacent SRAM transistors.

FIG. 1 illustrates an example of a FinFET 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section B-B is across a channel, gate dielectric 38, and gate electrode 40 of the finFET 30. Cross-section C-C is parallel to cross-section B-B and is across a source/drain region 42. Subsequent figures refer to these reference cross-sections for clarity.

FIGS. 2 through 15 are three dimensional and cross-sectional views of intermediate stages in the manufacturing of FinFETs in accordance with some embodiments. FIGS. 2 through 13 illustrate a FinFET similar to FinFET 30 in FIG. 1, except for multiple fins on a crown structure. In FIGS. 7A through 8C, figures ending with an "A" designation are three-dimensional views; figures ending with a "B" designation illustrate cross-section B-B; and figures ending with a "C" designation illustrate cross-section C-C. FIGS. 9 through 15 illustrate cross-section C-C.

Figure 2:
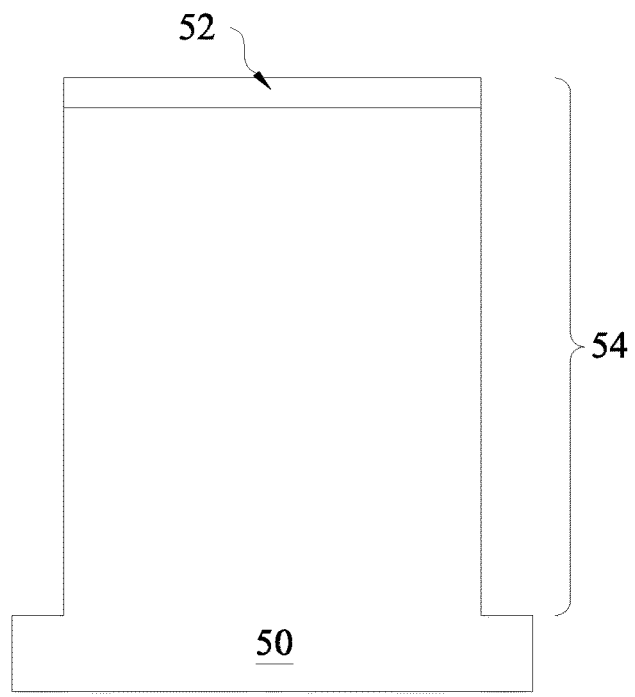
FIGS. 2 through 6, 7A-7C, 8A-8C, and 9 through 15 are three-dimensional and cross-sectional views of intermediate stages in the manufacturing of FinFETs in accordance with some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

FIG. 2 further illustrates the formation of a mask layer 52 over the substrate and the patterning of the substrate 50 using the mask layer 52 to form a patterned portion 54 of the substrate 50. In some embodiments, the mask layer 52 is a hard mask and may be referred to as hard mask 52 hereinafter. The hard mask 52 may be formed of silicon nitride, silicon oxynitride, silicon carbide, silicon carbonitride, the like, or a combination thereof.

In some embodiments, the patterned portion 54 of the substrate 50 may be formed by etching the substrate 50 that lies outside of the patterned mask layer 52. The etching may be any acceptable etch process, such as a reactive ion etch (RIE), neutral beam etch (NBE), the like, or a combination thereof. The etch may be anisotropic.

Figure 3:
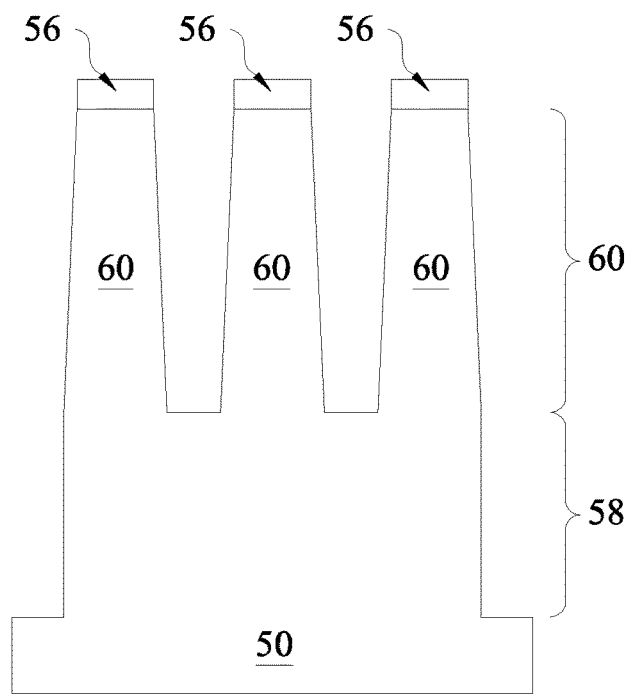

FIG. 3 illustrate the formation of a crown structure 58 and semiconductor strips 60 over the crown structure 58. A mask layer 56 may be formed and patterned over the patterned portion 54 of the substrate 50. In some embodiments, the mask layer 56 is a hard mask and may be referred to as hard mask 56 hereinafter. The hard mask 56 may be formed of silicon nitride, silicon oxynitride, silicon carbide, silicon carbonitride, the like, or a combination thereof.

In some embodiments, the crown structure 58 and the semiconductor strips 60 may be formed by etching trenches in the hard mask 56 and the patterned portion 54 of the substrate 50. The semiconductor strips 60 may also be referred to as semiconductor fins 60. The etching may be any acceptable etch process, such as a RIE, NBE, the like, or a combination thereof. The etch may be anisotropic.

Figure 4:
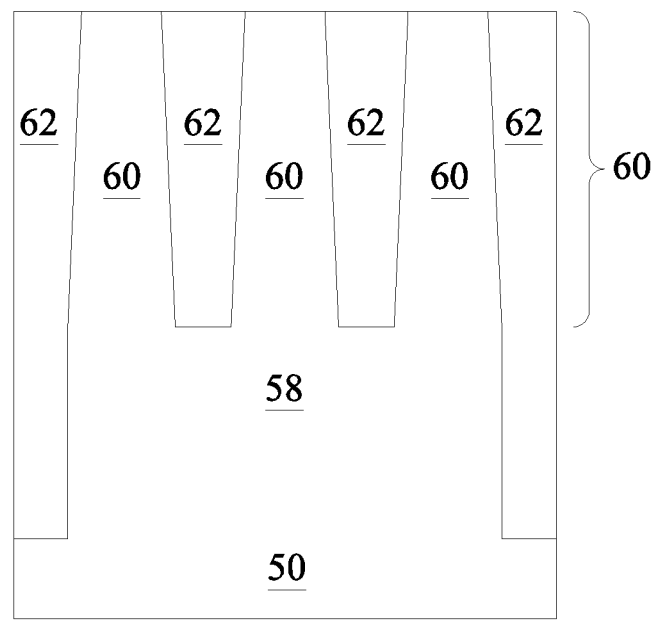

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIG. 4, a planarization process, such as a chemical mechanical polish (CMP), may remove any excess insulation material (and, if present, the hard mask 56) and form top surfaces of the isolation regions 62 and top surfaces of the semiconductor strips 60 that are coplanar.

Figure 5:
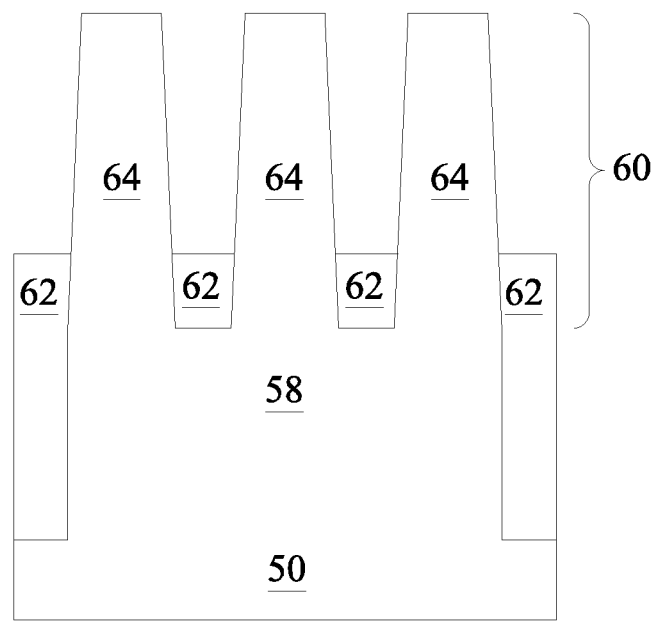
Figure 6:
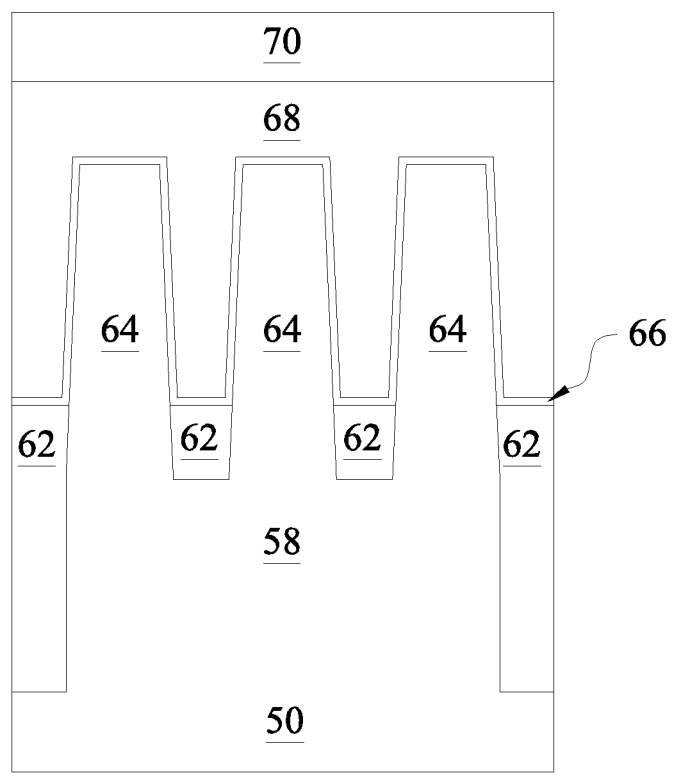

FIG. 5 illustrates the recessing of the isolation regions 62, such as to form shallow trench isolation (STI) regions. The isolation regions 62 are recessed such that the upper portions of the semiconductor strips 60 protrude from between neighboring isolation regions 62 and form semiconductor fins 64. As illustrated some portions of the isolation regions 62 remains on top of the crown structure 58 between the adjacent semiconductor fins 64. Further, the top surfaces of the isolation regions 62 may have a flat surface as illustrated, a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIG. 5 illustrates the formation of a gate structure over the semiconductor fins 64. A dielectric layer (not shown) is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 70. The pattern of the mask 70 then may be transferred to the gate layer and dielectric layer by an acceptable etching technique to form gate 68 and gate dielectric 66. The gate 68 and gate dielectric 66 cover respective channel regions of the semiconductor fins 64. The gate 68 may also have a lengthwise direction substantially perpendicular to the lengthwise direction of respective semiconductor fins 64.

Figure 7A:
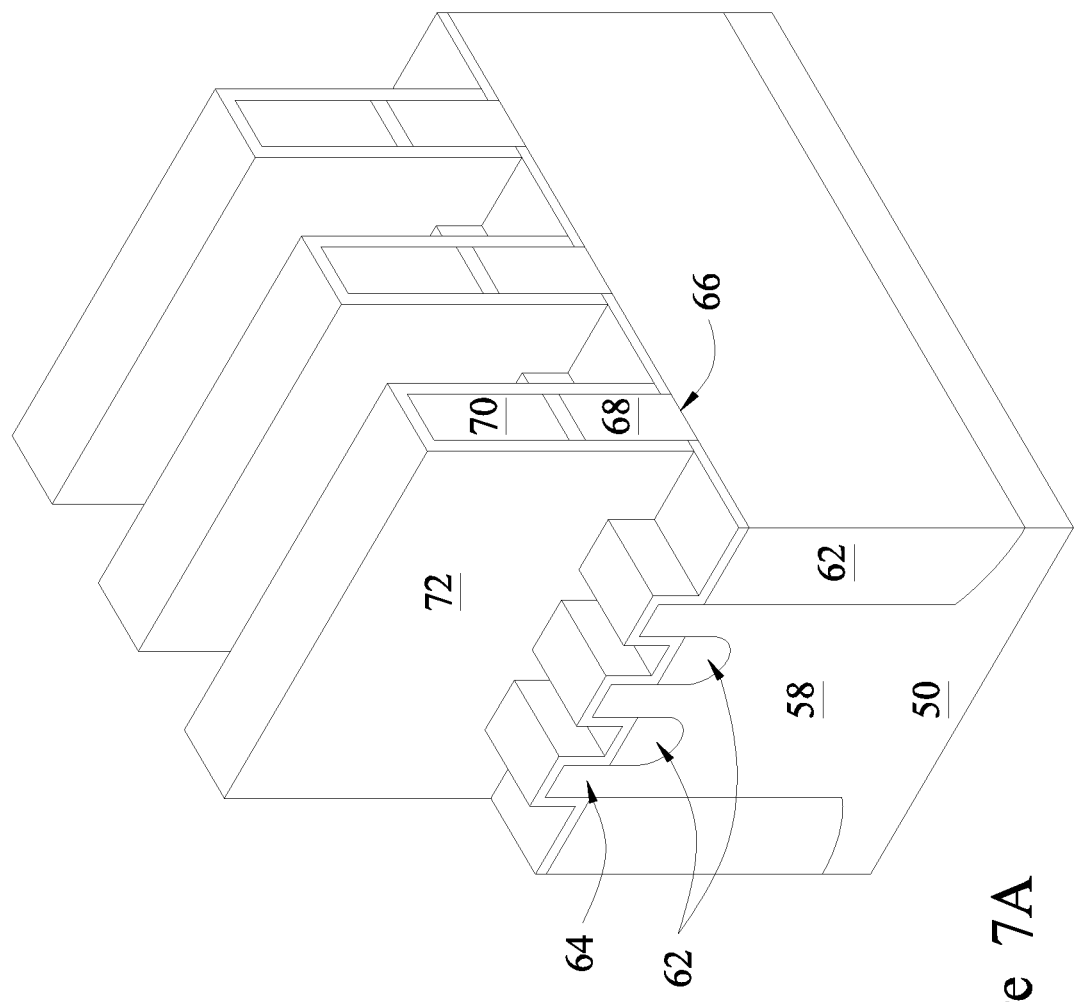
Figure 7B:
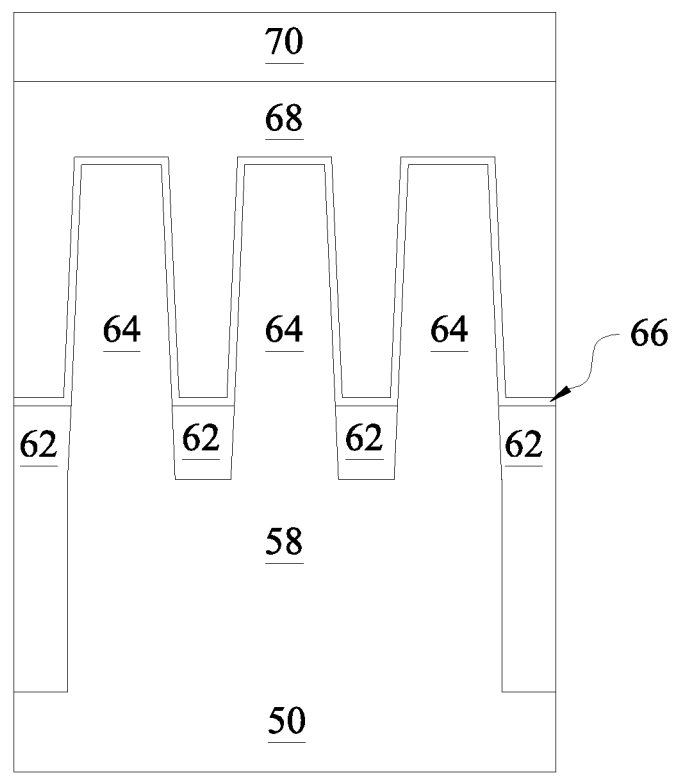
Figure 7C:
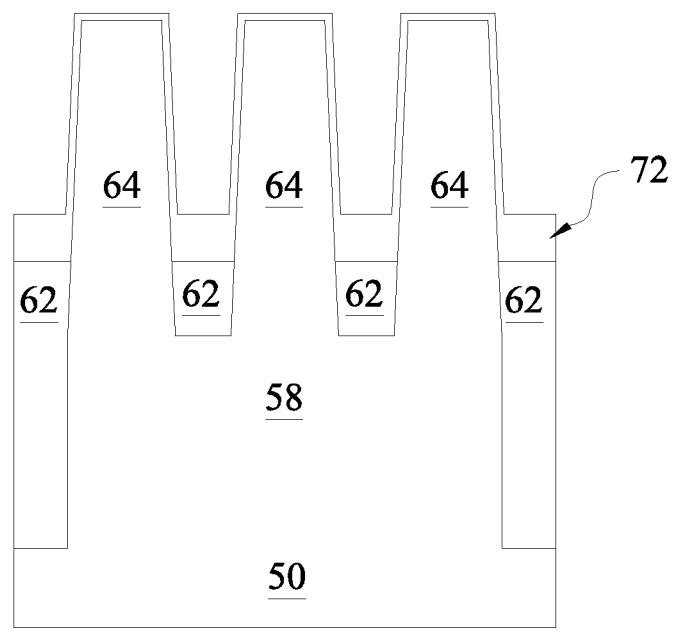

FIGS. 7A, 7B, and 7C illustrate the formation of gate seal spacers 72 on exposed surfaces of isolation regions 62, semiconductor fins 64, gate 68, and mask 70. A thermal oxidation or a deposition process may form the gate seal spacers 72. In some embodiments, the gate seal spacers 72 may be formed of a nitride, such as silicon nitride, silicon oxynitride, silicon carbide, silicon carbonitride, the like, or a combination thereof. The formation of the gate seal spacers 72 may be followed by an anisotropic etch process, such as a dry etch process, to remove portions of the gate seal spacers 72 outside of the sidewalls of the gate structures. In some embodiments, after the etch process, some portions of the gate seal spacers 72 remains on the isolation regions 62 between the adjacent semiconductor fins 64 (see FIGS. 9, 15, and 17).

Figure 8A:
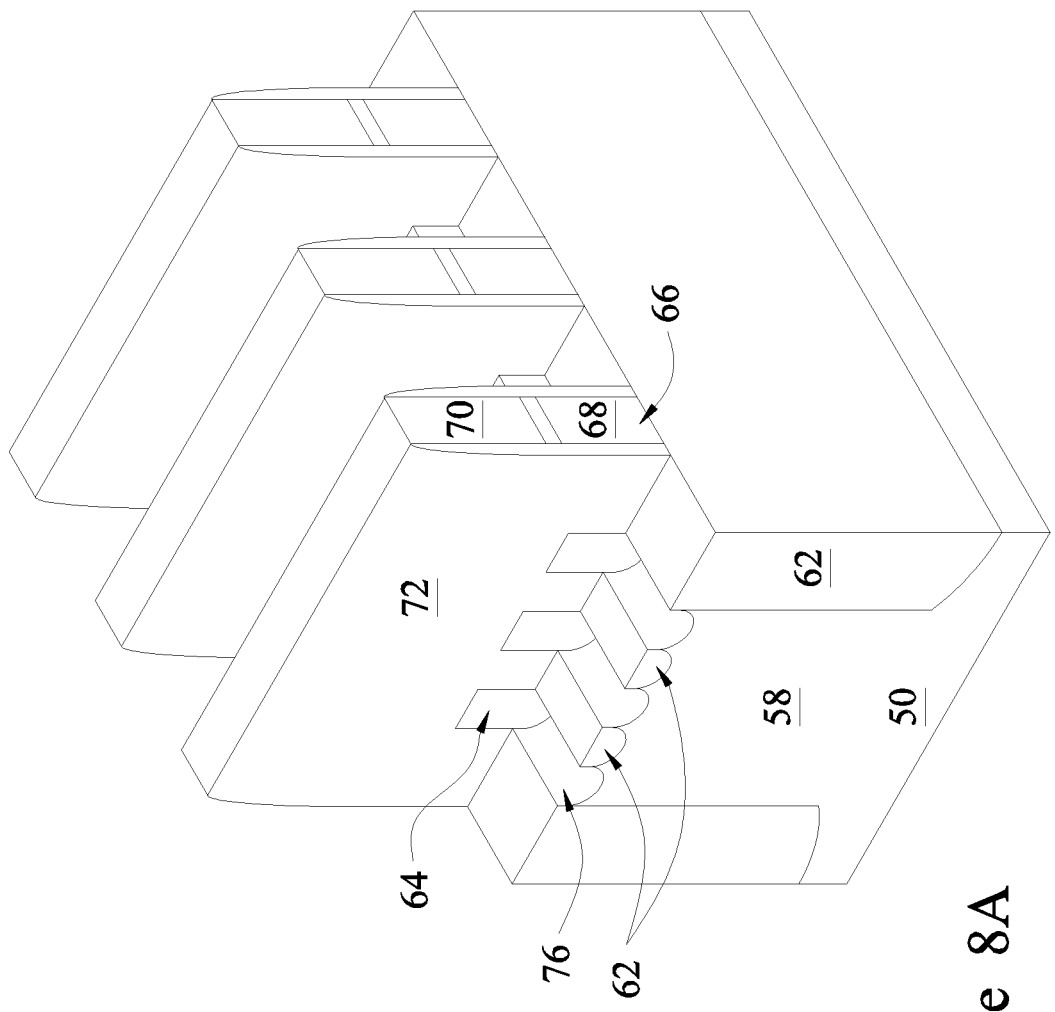
Figure 8B:
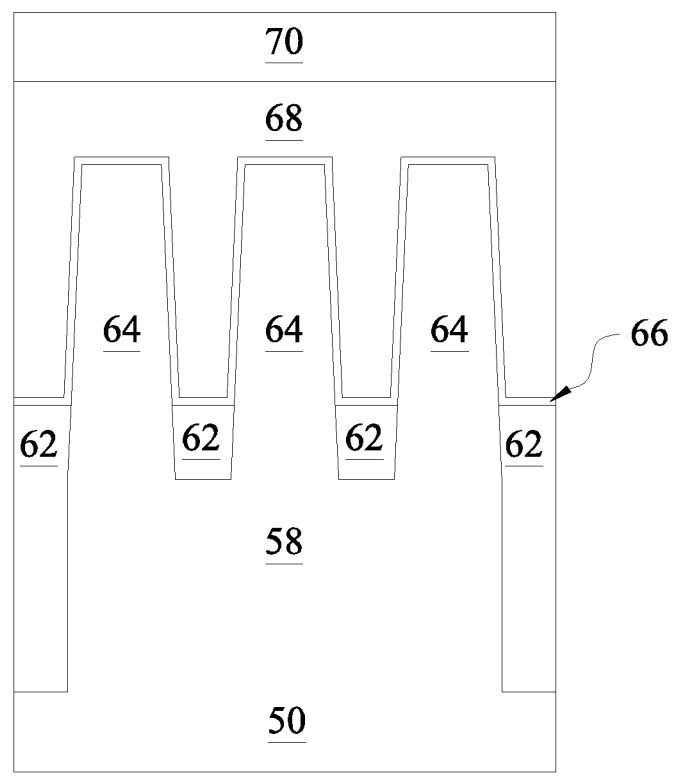
Figure 8C:
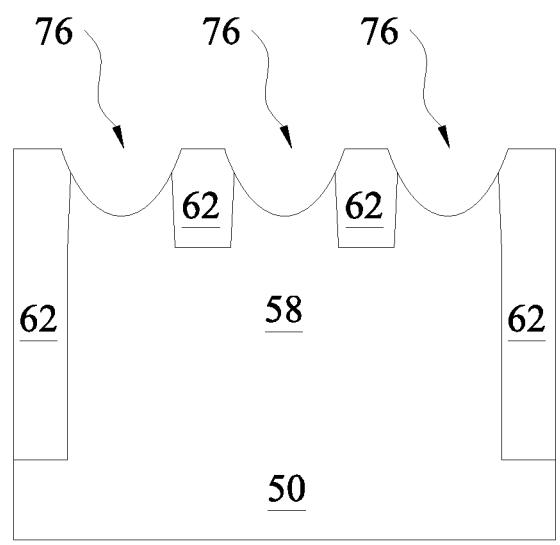

FIGS. 8A, 8B, and 8C illustrate the removal the semiconductor fins 64 outside of the gate structure. The gate structure may be used as a mask during the removal of the semiconductor fins 64 and such that recesses 76 are formed in in the semiconductor fins 64 and/or isolation regions 62. As illustrated, after the removal of the semiconductor fins 64, at least a portion of the isolation regions 62 remains on the top surface of the crown structure 58 between the adjacent semiconductor fins 64.

The recesses 76 may be formed by etching using any acceptable etch process, such as a RIE, NBE, tetramethylammonium hydroxide (TMAH), ammonium hydroxide (NH$_4$OH), a wet etchant capable of etching silicon with good etch selectivity between silicon and a material of the isolation regions 62 and/or the gate seal spacers 72, the like, or a combination thereof. The etch may be anisotropic. In some embodiments, the top surface of the crown structure 58 is exposed as at least portions of the bottom surfaces of the recesses 76.

Figure 9:
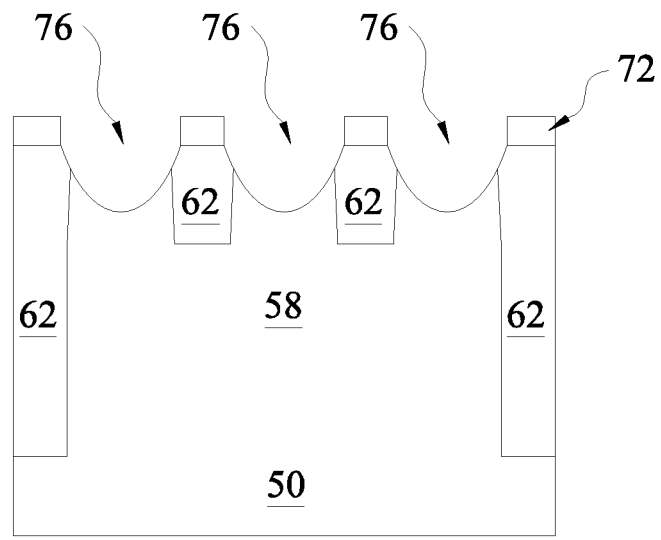

FIG. 9 illustrates an embodiment where a portion of the gate seal spacer material 72 remains on the isolation regions 62 between the adjacent semiconductor fins 64. In this embodiment, the etch process may be a direct bombardment etch process that removes the gate seal spacers 72 from top surfaces of the exposed semiconductor fins 64 (see FIG. 7C) while some portion of the gate seal spacer material 72 remains on the isolation regions 62. The reason that some gate seal spacer material 72 remains on the isolation regions 62 may be at least at least partially due to the gate seal spacer material 72 being formed thicker on the isolation regions 62 as compared to the top surface of the semiconductor fins 64 (see FIG. 7C).

Figure 10:
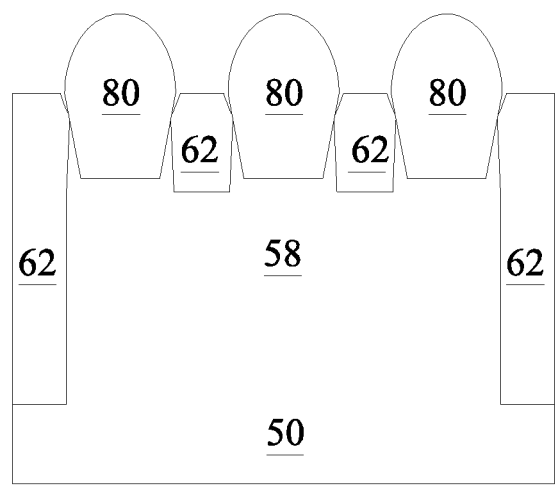
Figure 11:
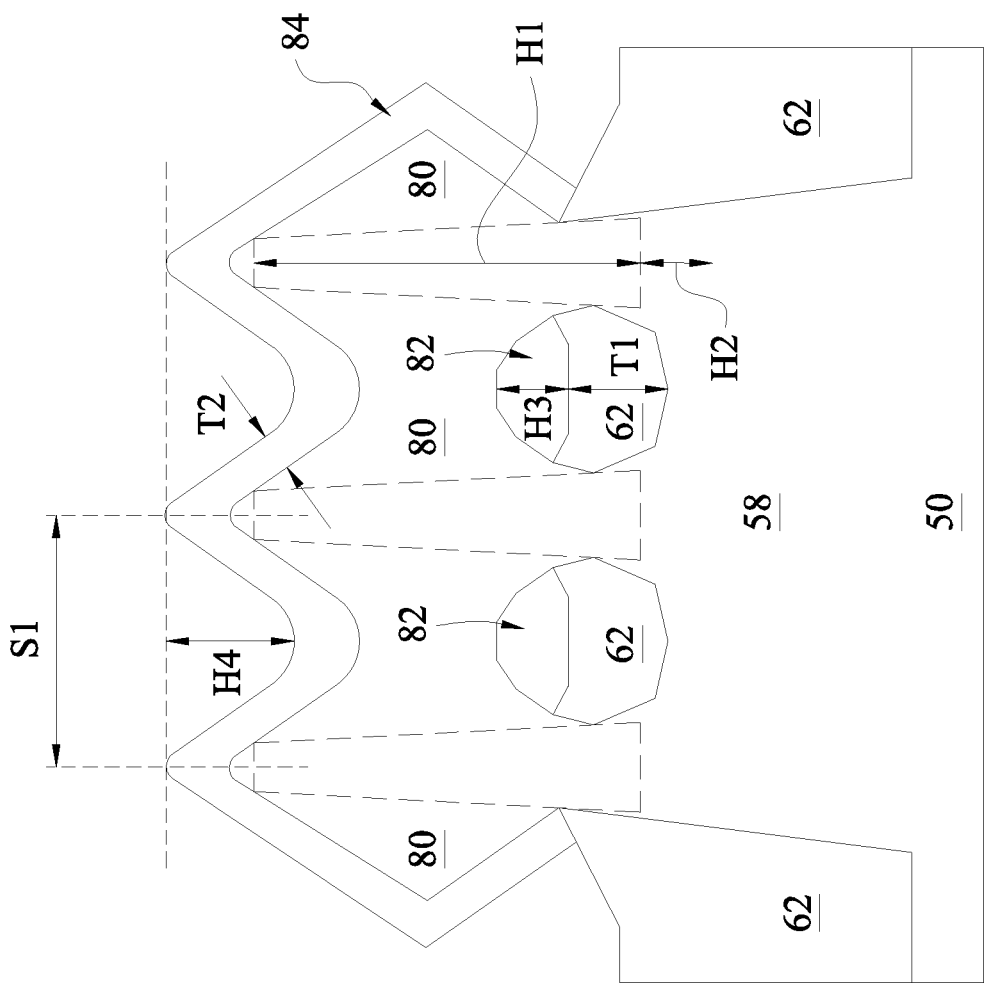

FIGS. 10 and 11 illustrate the formation of the source/drain regions 80. The source/drain regions 80 are formed in the recesses 76 by epitaxially growing a material in the recesses 76, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIG. 10, due to the blocking of the isolation regions 62 between the adjacent semiconductor fins 64, source/drain regions 80 are first grown vertically in recesses 76, during which time the source/drain regions 80 do not grow horizontally. After recesses 76 are fully filled, source/drain regions 80 are grown both vertically and horizontally to form facets (see FIG. 11).

As illustrated in FIG. 11, the source/drain regions 80 of the adjacent semiconductor fins 80 merge to form a continuous epitaxial source/drain region 80. Due to the blocking of the isolation regions 62 on the crown structure 58, air gaps 82 are formed between the lower portions of the source/drain regions 80 and the top surface of the isolation regions 62 on the crown structure 58.

After the formation of the source/drain regions 80, a capping layer 84 is formed on the source/drain regions 80. The capping layer 84 and the buffer layer may be considered part of the source/drain regions. In some embodiments, the capping layer 84 is epitaxially grown on the source/drain regions 80. The capping layer helps to protect the source/drain regions 8o from dopant loss during the subsequent processing (e.g. etching processes, temperature processing, etc.). The topography of the source/drain regions 80 may be controlled to be non-planar, as shown in FIG. 11, or planar (see FIG. 14).

The semiconductor fins 64 extend a height H1 above the top surface of the crown structure 58. In some embodiments, the height H1 is less than about 60 nm. In some embodiments, the height H1 is less than about 40 nm. In some embodiments, the height H1 is less than about 30 nm. The epitaxial source/drain regions 80 can extend into the crown structure 58 by a height H2. In some embodiments, the height H2 is in a range from about 5 nm to about 30 nm. This portion of the source/drain region 80 that extends into the crown structure 58 may be referred to as a buffer layer as it buffers the strain differences between the higher dopant concentration source/drain region 80 above it and the crown structure 58 below it. The dopant concentration of the buffer layer and the remaining portion of the source/drain region 80 can be different. For example, the buffer layer can have a Ge concentration of less about 40% while the rest of the source/drain region 80 has a Ge concentration of greater than 40%. The higher concentration of the remaining portion of the source/drain region 80 allows for the source/drain region 80 to apply greater stress to the channel region of the FinFET. This high dopant concentration portion of the source/drain 80 may be referred to a stressor layer 80. In addition, the dopant concentration of the capping layer 84 and the stressor layer 80 can be different. For example, the capping layer 84 can have a Ge concentration of less about 40% while the stressor layer 80 has a Ge concentration of greater than 40%.

In some embodiments, the buffer layer, the stressor layer 80, and the capping layer 84 can be formed in a single, continuous epitaxial process. In other embodiments, these structures may be formed in separate processes. In the embodiment with the single, continuous process, the processing parameters of the epitaxial process (e.g. process gas flow, temperature, pressure, etc.) can be varied to form these structures with the varying material compositions. For example, during the epitaxy, the flow rate of the germanium-containing precursor (such as $GeH_4$) may be at a first level during the formation of the buffer layer and may be increased to a second level when transitioning to the formation of the stressor layer 80. Further, the flow rate of the germanium-containing precursor may be decreased to a third level from the second level when transitioning to the formation of the capping layer 84.

As illustrated in FIG. 11, the remaining portion of the isolation region 62 on the crown structure 58 can have a thickness T1. In some embodiments, the thickness T1 is in a range from about 2 nm to about 15 nm. The air gaps 82 can have a height H3 greater than about 4 nm. The capping layer 84 can be formed to a thickness T2, which is greater than 2 nm. The top surface of the capping layer 84 can have a height H4 between its highest and lowest points. In some embodiments, the height H4 is greater than about 3 nm. Adjacent fins of the FinFET device can be separated by a spacing S1. In some embodiments, the spacing S1 less than about 40 nm.

In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions followed by an anneal. The implanting process may include forming and patterning masks such as a photoresist to cover the regions of the FinFET that are to be protected from the implanting process. The source/drain regions 80 may have an impurity concentration in a range from about $10^{19}$ cm$^{-3}$ to about $10^{21}$ cm$^{-3}$. In some embodiments, the epitaxial source/drain regions 80 may be in situ doped during growth.

Subsequent processing of the FinFET device may be performed, such as the formation of one or more interlayer dielectrics and formation of contacts. These processes will be discussed below in reference to FIGS. 12 and 13.

Figure 12:
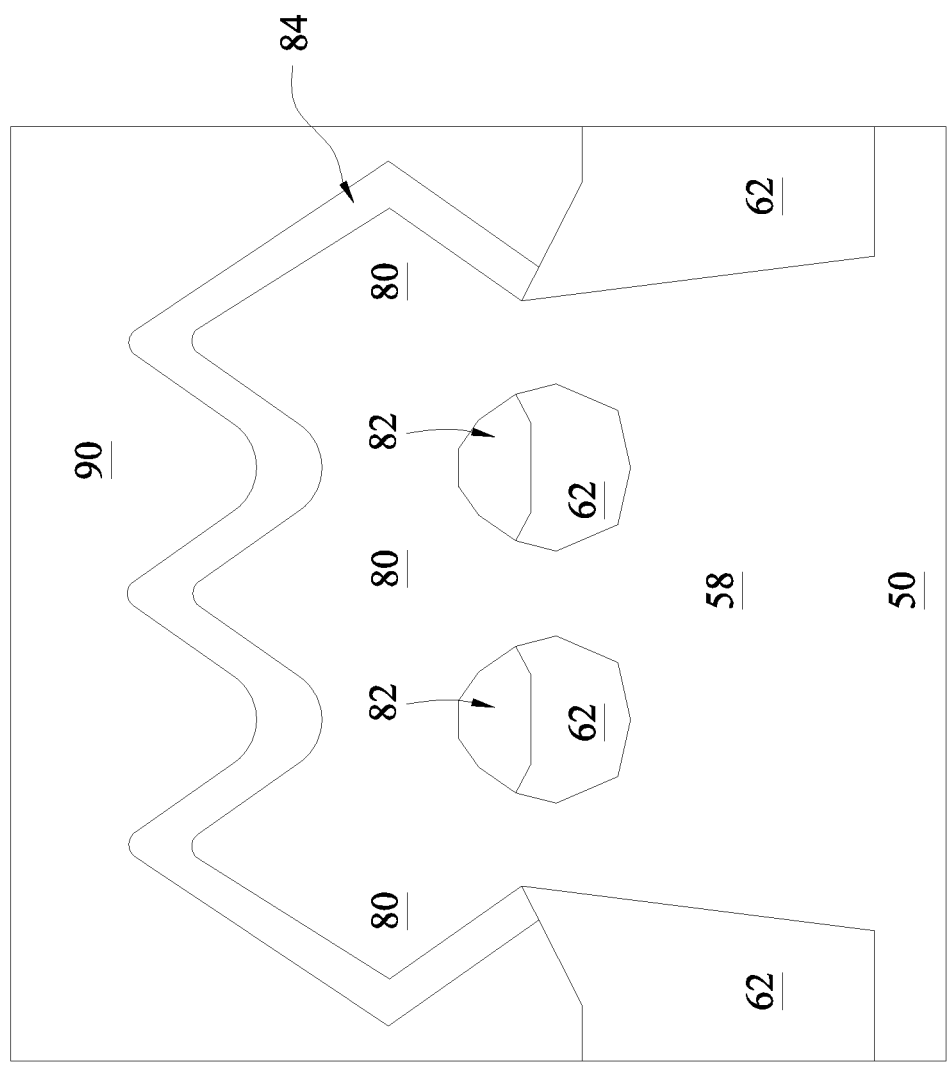

In FIG. 12, an interlayer dielectric (ILD) 90 is deposited over the structure illustrated in FIG. 11. The ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 13:
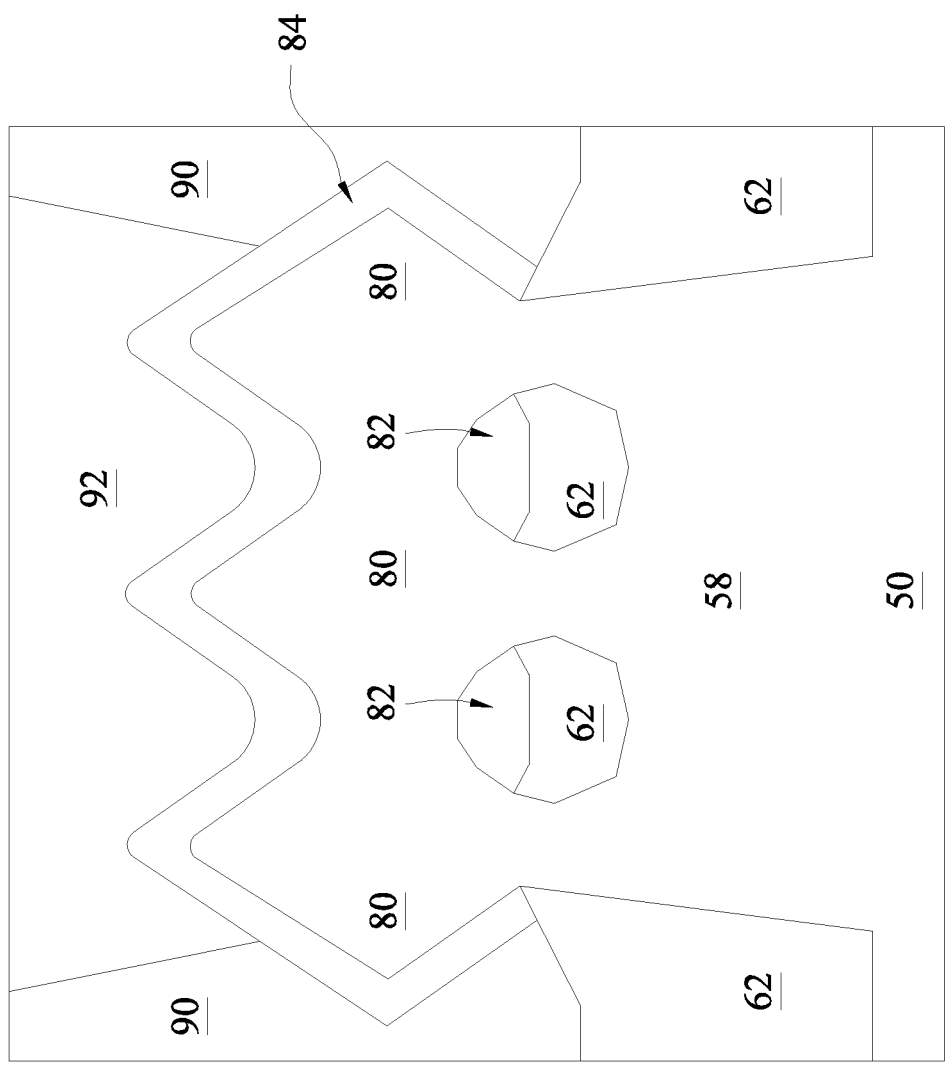

In FIG. 13, a contact 92 is formed through ILD 90. The opening for contact 92 is formed through the ILD 90. The opening may be formed using acceptable photolithography and etching techniques. In some embodiments, at least a portion of the capping layer 84 is removed during the formation of the opening. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 90. The remaining liner and conductive material form contacts 92 in the openings. An anneal process may be performed to form a silicide at the interface between the source/drain regions 80 (if present, capping layer 84) and the contact 92. The contact 92 is physically and electrically coupled to the source/drain regions 80 (if present, capping layer 84).

Although not explicitly shown, a person having ordinary skill in the art will readily understand that further processing steps may be performed on the structure in FIG. 13. For example, various inter-metal dielectrics (IMD) and their corresponding metallizations may be formed over ILD 90. Further, contacts to the gate electrode 68 may be formed through overlying dielectric layers.

Further, in some embodiments, a gate-last process (sometimes referred to as replacement gate process) may be used. In those embodiments, the gate 68 and the gate dielectric 66 may be considered dummy structures and will be removed and replaced with an active gate and active gate dielectric during subsequent processing.

Figure 14:
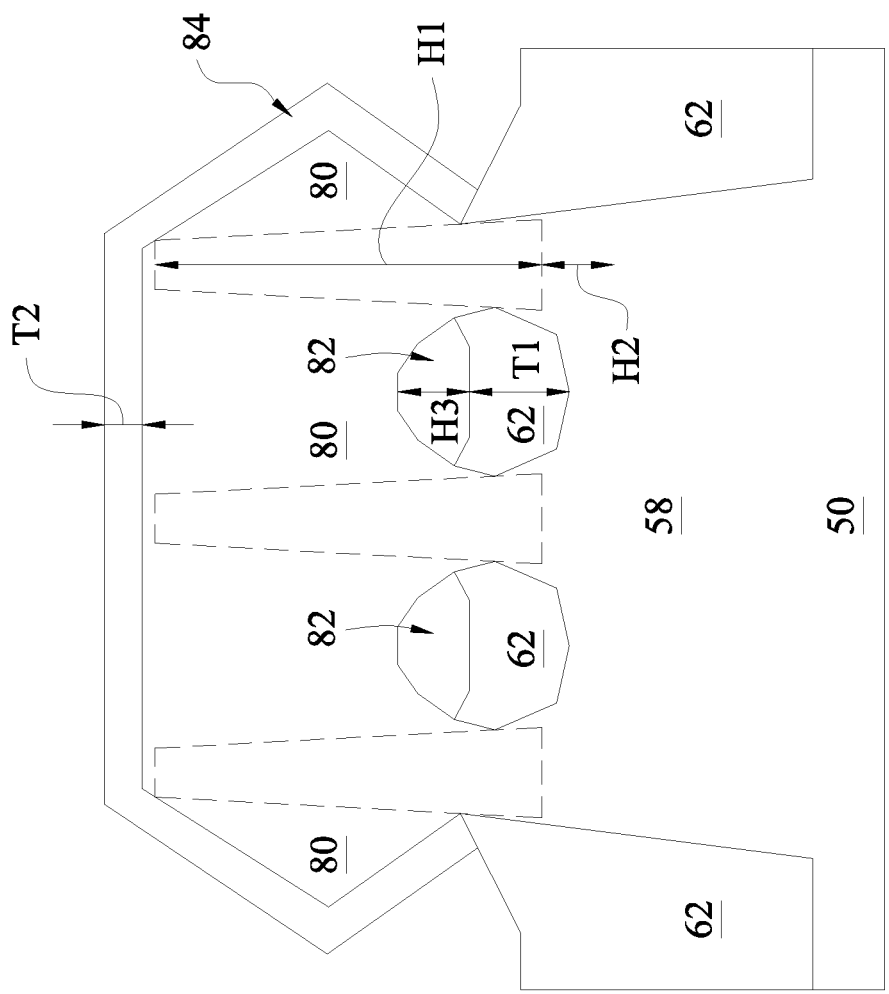

FIG. 14 illustrates an embodiment with the source/drain region 80 having a substantially flat surface. This embodiment is similar to the embodiment described above in FIGS. 2 through 13 except that this embodiment has a flat top surface for the source/drain region 80 whereas the previous embodiment had an undulating top surface (e.g. wavy top surface). Details regarding this embodiment that are similar to those for the previously described embodiment will not be repeated herein.

The shape/configuration of the top surface may be controlled by varying the parameters of the epitaxial process used to form the source/drain region 80. For example, by performing the epitaxial process for a longer timeframe, the source/drain region will change from the wavy top surface configuration to the flat top surface configuration.

Figure 15:
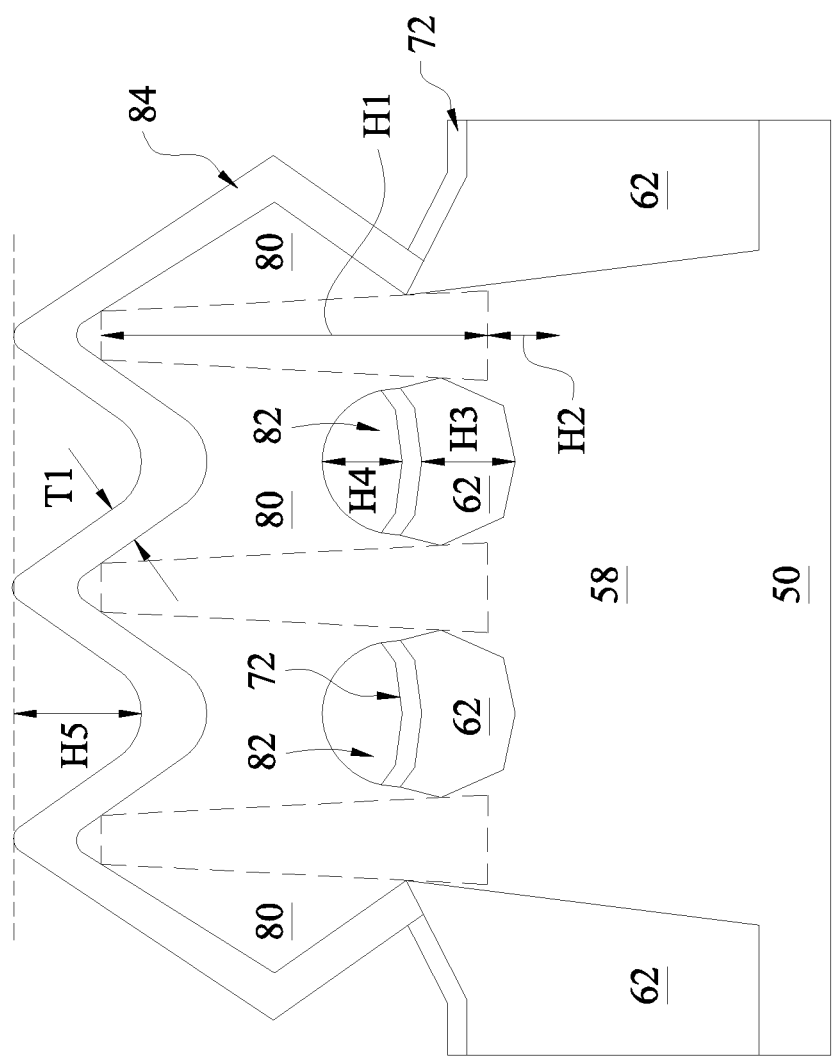

FIG. 15 is a cross-sectional view of an intermediate stage in the manufacturing of FinFETs in accordance with an exemplary embodiment. This embodiment is similar to the embodiment described above in FIGS. 2 through 14 except that this embodiment includes a remaining portion of the gate seal spacer 72 between the adjacent semiconductor fins 64. Details regarding this embodiment that are similar to those for the previously described embodiment will not be repeated herein.

This embodiment is similar to the embodiment illustrated in FIG. 9 with the source/drain regions 80 and the capping layer 84 being formed on the structure of FIG. 9. The addition of the remaining portion of the gate seal spacer 72 on the remaining portion of the isolation region 62 between the adjacent fins can increase the height H4 of the air gaps 82 as compared to the embodiment without the portion of the gate seal spacer 72 between the fins.

Although the embodiments in FIGS. 2 through 15 illustrate three fins for each FinFET, other embodiments contemplate more or less fins for each FinFET.

Figure 16:
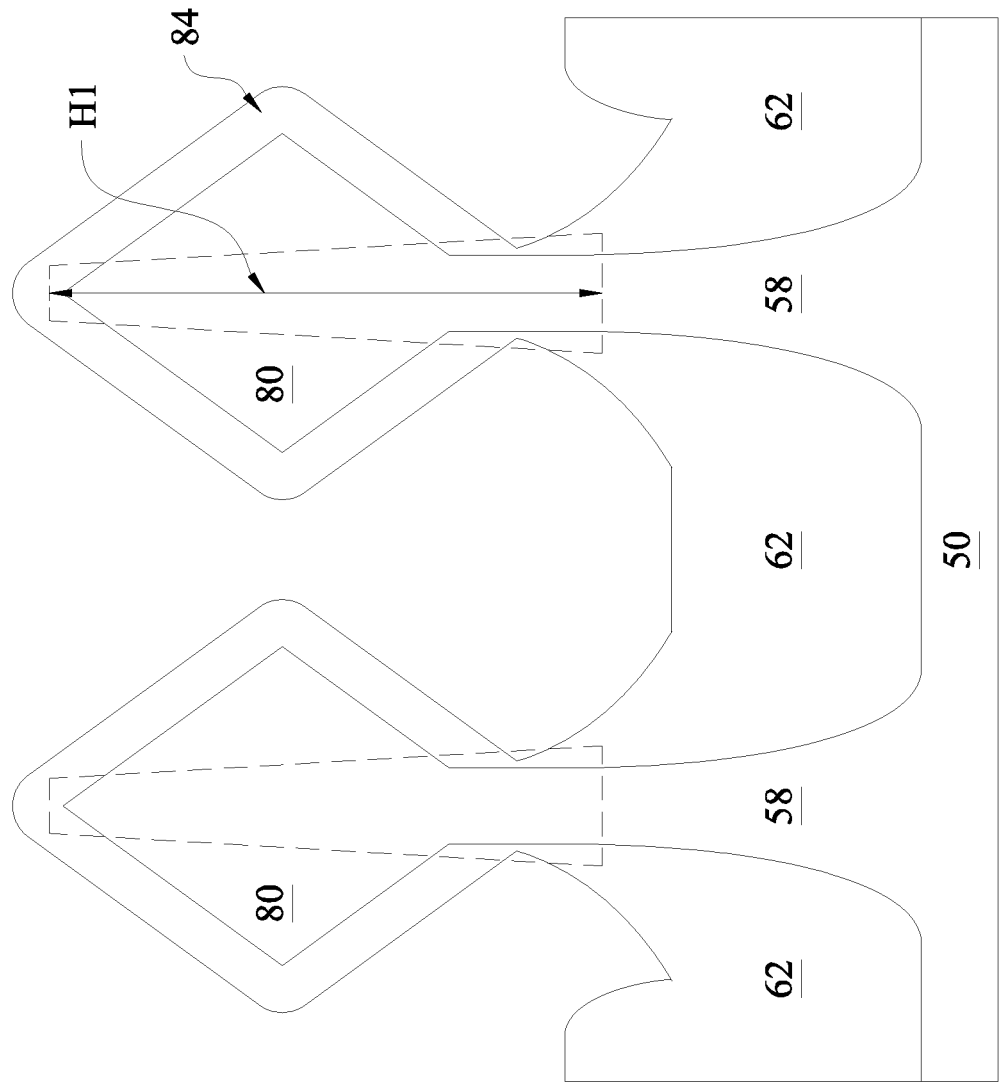
FIG. 16 is a cross-sectional view of an intermediate stage in the manufacturing of FinFETs in accordance with some embodiments.

FIG. 16 is a cross-sectional view of an intermediate stage in the manufacturing of FinFETs in accordance with an exemplary embodiment. FIG. 16 illustrates cross-section C-C of FIG. 1. This embodiment is similar to the embodiment described above in FIGS. 2 through 15 except that this embodiment is an embodiment with a single fin for the FinFET whereas the previous embodiment had three fins for the FinFET. Details regarding this embodiment that are similar to those for the previously described embodiment will not be repeated herein.

In some embodiments, the structure in FIG. 16 may be used for a p-type metal-oxide-semiconductor (PMOS) transistor in an SRAM device. For example, the device in FIG. 15 may be used as a pull-up transistor in the SRAM device. In some embodiment, the source/drain regions 80 include SiGe, and a p-type impurity such as boron or indium. Similar to the previous embodiment, some portion of the isolation regions 62 remains near the opening of the recess that is formed when the semiconductor fin 64 is etched back. This remaining isolation region 62 helps to constrain the epitaxial volume of the source/drain region 80, which can reduce the likelihood that the source/drain regions 80 of adjacent SRAM transistors will merge together. This reduced likelihood of merging increases the yield of the device while still allowing for the desired reduced spacing between adjacent SRAM transistors.

Figure 17:
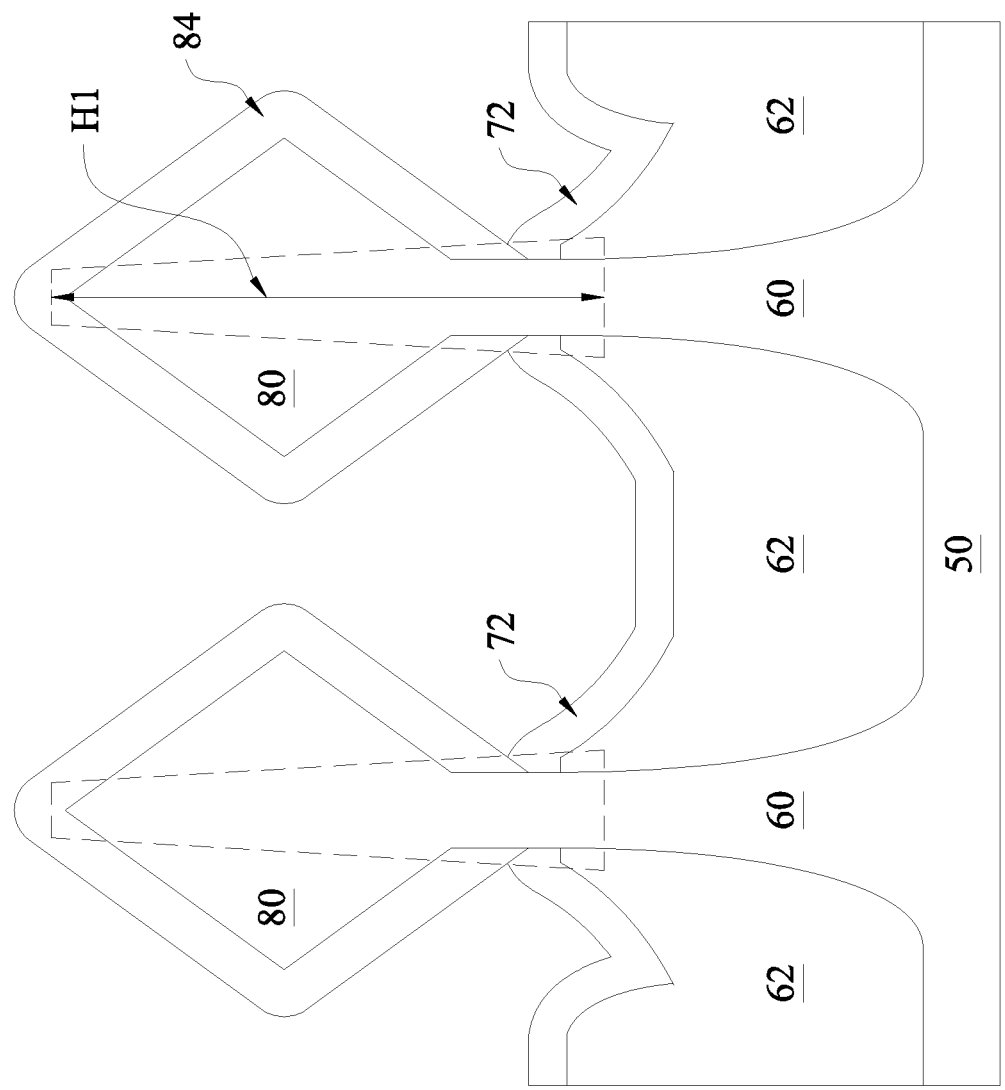
FIG. 17 is a cross-sectional view of an intermediate stage in the manufacturing of FinFETs in accordance with some embodiments.

FIG. 17 is a cross-sectional view of an intermediate stage in the manufacturing of FinFETs in accordance with an exemplary embodiment. FIG. 17 illustrates cross-section C-C of FIG. 1. This embodiment is similar to the embodiment described above in FIG. 16 except that this embodiment includes a remaining portion of the gate seal spacer 72 surrounding the fins including a portion between the adjacent fins. Details regarding this embodiment that are similar to those for the previously described embodiment will not be repeated herein.

The addition of the remaining portion of the gate seal spacer 72 on the remaining portion of the isolation region 62 between the adjacent fins can further constrain the epitaxial volume of the source/drain regions 80 and can further reduce the likelihood of adjacent source/drain regions 80 merging together as compared to the embodiment without the portion of the gate seal spacer 72 between the fins. The thicker the material (e.g. 62 and 72) surrounding the fins and near the opening of the recess that is formed when the semiconductor fin 64 is etched back, the more constrained the epitaxial volume of the source/drain regions 80 are, and thus, the likelihood that the source/drain regions 80 of adjacent SRAM transistors will merge together is further reduced.

Figure 18:
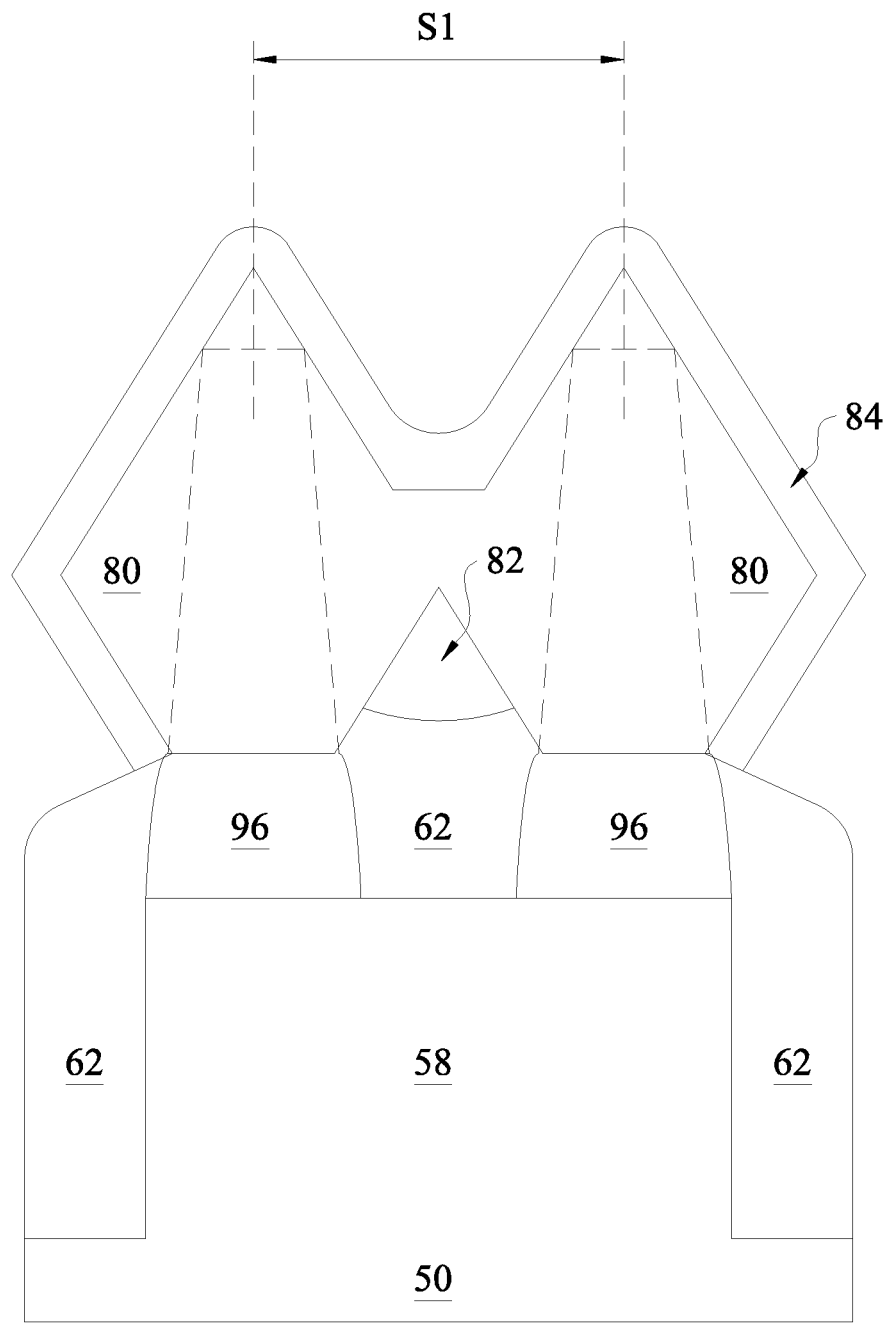
FIG. 18 is a cross-sectional view of an intermediate stage in the manufacturing of FinFETs in accordance with some embodiments.

FIG. 18 is a cross-sectional view of an intermediate stage in the manufacturing of FinFETs in accordance with an exemplary embodiment. FIG. 18 illustrates cross-section C-C of FIG. 1. This embodiment is similar to the embodiments described above in FIGS. 16 and 17 except that this embodiment includes two fins on the crown structure 58. Details regarding this embodiment that are similar to those for the previously described embodiment will not be repeated herein.

In some embodiments, the structure in FIG. 18 may be used for an n-type metal-oxide-semiconductor (NMOS) transistor in an SRAM device. For example, the device in FIG. 18 may be used as a pull-down transistor in the SRAM device. In this embodiment, the source/drain regions 80 may comprise SiC, SiP, SiCP, or the like. Similar to the previous embodiments, some portion of the isolation regions 62 remains near the opening of the recess that is formed when the semiconductor fin 64 is etched back. This remaining isolation region 62 helps to form the air gaps 82 between adjacent semiconductor fins 64. In this embodiment, the buffer layer is labeled as buffer layer 96 whereas in previous embodiments, the buffer layer was included in the source/drain regions 80. Similar to the previous embodiments, the buffer layer 96 comprises similar dopants as the source/drain region 80 but with lower dopant concentration.

Although not shown, this embodiment can also include the remaining portion of the gate seal spacer 72 on the remaining portion of the isolation region 62 between the adjacent fins (see FIG. 17).

Embodiments may achieve advantages. For example, the present disclosure is a semiconductor device and method of forming the same to provide a simple and cost-effective process flow to achieve a epitaxial source/drain in a FinFET with less defects (such as dislocations), at least near a channel region of the FinFET, for device enhancement. In addition, this simple and cost-effective process flow may achieve better isolation between adjacent fins by reducing the leakage between adjacent fins and may also reduce the contact resistance to the source/drain region. In particular, embodiments such as those disclosed below include a process flow that utilizes a FinFET crown structure with some of the isolation material of the isolation region (e.g. shallow trench isolation (STI) region) that remaining on a top surface of the crown between adjacent fins. This remaining isolation material suppresses the generation of dislocations because it reduces the amount of epitaxial volume between adjacent fins. Further, the isolation region causes an air gap to be formed between the top surface of the crown structure and the epitaxial source/drain region, which will reduce the dielectric constant (k value), which can reduce the parasitic capacitance between the adjacent fins. This reduced parasitic capacitance can allow for better alternating current (AC) performance for the device. Further, an upper surface of the epitaxial source/drain structure may have a non-planar (e.g. undulating) top surface, which can increase the contact surface area for the overlying contact. This increased contact surface area can reduce the contact resistance to the source/drain region.

An embodiment is a structure including a first fin over a substrate, a second fin over the substrate, the second fin being adjacent the first fin, an isolation region surrounding the first fin and the second fin, a gate structure along sidewalls and over upper surfaces of the first fin and the second fin, the gate structure defining channel regions in the first fin and the second fin, a source/drain region on the first fin and the second fin adjacent the gate structure, and an air gap separating the source/drain region from a top surface of the substrate.

Another embodiment is a method including forming a raised portion of a substrate, forming fins on the raised portion of the substrate, forming an isolation region surrounding the fins, a first portion of the isolation region being on a top surface of the raised portion of the substrate between adjacent fins, forming a gate structure over the fins, and forming source/drain regions on opposing sides of the gate structure, at least one of the source/drain regions having an air gap separating the at least one source/drain region from the first portion of the isolation region.

A further embodiment is a method including forming a first fin over a substrate, forming an isolation region surrounding the first fin, forming a first gate structure over the first fin, recessing the first fin outside of the first gate structure to have a top surface below a top surface of the isolation region, and epitaxially growing a first source/drain region from the recessed first fin outside of the first gate structure, the isolation region constraining the epitaxial growth of the first source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    patterning a substrate to form a raised portion, a first fin extending from the raised portion, and a second fin extending from the raised portion;
    forming a first isolation region on a first top surface of the raised portion of the substrate and between the first fin and the second fin, the first isolation region extending along opposing sidewalls of the raised portion of the substrate;
    forming a gate structure along sidewalls and over upper surfaces of the first fin and the second fin;
    forming a first dielectric layer on the first isolation region;
    forming a first semiconductor layer on the first fin and a second semiconductor layer on the second fin adjacent the gate structure, the first semiconductor layer and the second semiconductor layer having a first dopant concentration;
    forming a first epitaxial region over the first semiconductor layer, the first epitaxial region comprising a second semiconductor material;
    forming a second epitaxial region over the second semiconductor layer, the second epitaxial region comprising the second semiconductor material, wherein the first epitaxial region is merged with the second epitaxial region to form a merged epitaxial region, the first dielectric layer extending from the first epitaxial region to the second epitaxial region, the merged epitaxial region having a second dopant concentration greater than the first dopant concentration, wherein the merged epitaxial region extends over the first dielectric layer, wherein a void is between the merged epitaxial region and the first isolation region, wherein the first dielectric layer extends between the void and the first isolation region; and
    forming a capping layer directly on the first epitaxial region and the second epitaxial region, wherein the capping layer has a third dopant concentration less than the second dopant concentration.

2. The method of claim 1, further comprising:
    prior to forming the first semiconductor layer, recessing the first fin and the second fin, wherein the first semiconductor layer is formed on the recessed first fin and the second semiconductor layer is formed on the recessed second fin.

3. The method of claim 2, wherein recessing the first fin and the second fin forms recesses extending into the raised portion.

4. The method of claim 3, wherein a depth of the recesses is in a range from 5 nm to 30 nm.

5. The method of claim 1, wherein the first dopant concentration and the second dopant concentration are germanium concentrations.

6. The method of claim 5, wherein the first dopant concentration is less than about 40%, wherein the second dopant concentration is greater than about 40%.

7. The method of claim 1, wherein the first isolation region comprises a single isolation layer surrounding the raised portion, the first fin, and the second fin.

8. A method of forming semiconductor device, the method comprising:
    forming a first fin and a second fin extending from a raised portion of a substrate;
    a first isolation region on a first top surface of the raised portion of the substrate and between the first fin and the second fin, the first isolation region extending along opposing sidewalls of the raised portion of the substrate;
    forming a gate structure along sidewalls and over upper surfaces of the first fin and the second fin; and
    forming an epitaxial region over the first fin and the second fin adjacent the gate structure, the epitaxial region extending over the first isolation region, wherein the epitaxial region comprises:
        a semiconductor layer on the first fin and the second fin, the semiconductor layer having a first dopant concentration;
        a stressor layer on the semiconductor layer, the stressor layer having a second dopant concentration, the second dopant concentration being larger than the first dopant concentration; and
        a capping layer on the stressor layer, the capping layer having a third dopant concentration, the third dopant concentration being less than the second dopant concentration, wherein a void extends between the epitaxial region and the first isolation region.

9. The method of claim 8, wherein a height of the void is greater than about 4 nm.

10. The method of claim 8, wherein an upper surface of the first fin at an interface between the first fin and the semiconductor layer is curved.

11. The method of claim 8, further comprising prior to forming the epitaxial region:
    forming recesses in the first fin and the second fin, wherein forming the epitaxial region comprises forming the epitaxial region in the recesses.

12. The method of claim 11, wherein the recesses extend lower than an upper surface of the raised portion of the substrate.

13. The method of claim 12, wherein the recesses extend below the upper surface of the raised portion by a distance in a range of 5 nm to 30 nm.

14. The method of claim 13, wherein a thickness of the first isolation region between the first fin and the second fin is in a range of 2 nm to 15 nm.

15. The method of claim 8, wherein a distance from an upper surface of the capping layer over the first fin to the upper surface of the capping layer between the first fin and the second fin is greater than 3 nm.

16. A method of forming a semiconductor device, the method comprising:
    forming a first fin and a second fin extending from a raised portion of a substrate, the first fin and the second fin comprising a first semiconductor material;
    forming an isolation region along opposing sidewalls of the raised portion of the substrate and over the raised portion between the first fin and the second fin;

forming a gate structure along sidewalls and over upper surfaces of the first fin and the second fin;

a dielectric layer along sidewalls of the gate structure, the dielectric layer completely covering an upper surface of the isolation region between the first fin and the second fin;

forming a source/drain region over the first fin and the second fin, the source/drain region comprising a second semiconductor material, the second semiconductor material being different than the first semiconductor material, the second semiconductor material of the source/drain region extending continuously from the first fin to the second fin, wherein a void is interposed between the source/drain region and the dielectric layer, wherein the void exposes a surface of the second semiconductor material; and forming a semiconductor capping layer over the source/drain region, wherein a dopant concentration of the semiconductor capping layer is less than a dopant concentration of the source/drain regions.

17. The method of claim 16, wherein the dielectric layer comprises gate seal spacers.

18. The method of claim 16, wherein the dopant concentration of the semiconductor capping layer is a first germanium concentration, and wherein the dopant concentration of the source/drain region is a second germanium concentration.

19. The method of claim 18, wherein the first germanium concentration is less than 40%, wherein the second germanium concentration is greater than 40%.

20. The method of claim 19, wherein forming the source/drain region comprises:

forming a buffer layer, the buffer layer having a third germanium concentration less than the second germanium concentration.

\* \* \* \* \*